United States Patent [19]

Dubon-Chevallier et al.

[11] Patent Number: 5,412,233
[45] Date of Patent: May 2, 1995

[54] HETEROJUNCTION BIPOLAR TRANSISTOR

[75] Inventors: Chantal Dubon-Chevallier, Chatillon; Jean Dangla, Les Ulis; Jean-Louis Benchimol, Palaiseau; François Alexandre, Vitry Sur Seine, all of France

[73] Assignee: France Telecom, Paris, France

[21] Appl. No.: 78,585

[22] Filed: Jun. 16, 1993

[30] Foreign Application Priority Data

Jun. 17, 1992 [FR] France ................. 92 07354

[51] Int. Cl.⁶ .............................................. H01L 33/00
[52] U.S. Cl. .................................. 257/197; 257/198
[58] Field of Search ............................. 257/197, 198

[56] References Cited

U.S. PATENT DOCUMENTS 4,825,269  4/1989  Plummer et al. ................. 257/197

FOREIGN PATENT DOCUMENTS 62-39063   2/1987  Japan .................................. 257/197
63-306660 12/1988  Japan .................................. 257/198
0297886    1/1989  Japan .................................. 257/198
3192727    8/1991  Japan .................................. 257/197

*Primary Examiner*—Andrew J. James
*Assistant Examiner*—Stephen D. Meier
*Attorney, Agent, or Firm*—Blakely, Sokoloff, Taylor & Zafman

[57] ABSTRACT

Process for producing a transistor, particularly a heterojunction bipolar transistor, of the type comprising the known stages consisting in producing layers forming the collector, base and emitter, as well as collector, base and emitter ohmic contacts. The emitter producing stage consists in depositing, on the base layer, two superposed layers making up the emitter, the first of which is a thin layer made up of a first material having a large energy gap, and the second made up of a second material also having a high energy gap. The base ohmic contact is deposited on the first layer of the emitter. The invention also relates to the transistors obtained.

22 Claims, 1 Drawing Sheet

HETEROJUNCTION BIPOLAR TRANSISTOR

BACKGROUND OF THE INVENTION

1. Field of the Invention

The present invention relates to the field of transistor design. More particularly, it is related to the production of heterojunction bipolar transistors.

2. Background Information

The operating principles of heterojunction bipolar transistors, as well as their main fields of application, are well known to those skilled in the art. These operating principles and fields of application have been the object of much literature. Reference can be made, for example, to the following papers: 1) "Heterostructure Bipolar Transistors and Integrated Circuits", H. Kroemer, Proc. IEEE 25 (1), January 1982; 2) "GaAlAs/GaAs Heterojunction Bipolar Transistors: Issues and Prospects for Applications" P. Asbeck, M. Chang, J. Higgins, N. Sheng, G. Sullivan, K. Wang, IEEE Trans. Electron. Dev. 36 (10), October 1989; 3) "GaAs Heterojunction Bipolar Transistor Device and IC Fabrication Technology for High Performance Analog and Microwave Applications", M. Kim, A. Oki, G. Gorman, D. Umemoto, J. Camou, Trans. Microwave Theory Tech., 37 (9), September 1989.

As shown in the accompanying FIG. 1, conventional heterojunction bipolar transistor structures generally comprise a semi-insulating substrate 10, a GaAs n+ collector contact layer 12, a GaAs n− collector layer 14, a GaAs p+ layer forming the base 16, a GaAlAs n emitter layer 18 and a GaAs n+ emitter contact layer 20.

As shown in the accompanying FIG. 1, the technology most commonly employed for treating these structures is double mesa technology. This technology consists in effecting a first etch at 22 to contact the base layer 16, and then a second etch at 24 to contact the collector contact layer 12. Ohmic contacts 30, 32 and 34 are then deposited on the emitter contact layer 20, base layer 16 and collector contact layer 12.

In this type of technology, the emitter 18—base 16 junction is exposed by etching 22 which induces high surface currents.

To improve the component's performance, emitter 30 and base contacts 32, and also possibly collector contacts 34, must be self-aligned, and the size of the component also reduced.

However, reducing the size of the component increases the edge-to-surface area ratio of the emitter 18—base 16 junction, and makes the surface recombination problem of the emitter 18—base 16 junction even more critical.

Surface currents result in a very significant drop in gain which prevents the component from being used under the best conditions.

Many solutions have already been suggested in an attempt to overcome this problem.

For example, in the papers "Near-ideal Transport in an AlGaAs/GaAs Heterostructure Bipolar Transistor by Na2S-9H2O Regrowth", R. Nottenburgh, C. Sandorff, D. Humphrey, T. Hollenbeck, R. Bhat, Appl. Phys. Lett., 52(3), January 1988 and "Suppression of the Emitter Size Effect on the Current Gain of AlGaAs/GaAs HBT by Utilizing (NH4)2SX Treatment", S. Shokata, H. Okada, H. Hayashi, Inst. Phys. Ser., 112, 1991, it was shown that surface recombinations could be reduced by exposing the surface to solutions of the type $Na_2S.9H_2O$ and $(NH_4)2S_x$. This passivation, however, poses real technological problems: stability in time, compatibility with future technological treatments, etc.

The paper "Super-gain AlGaAs/GaAs Heterojunction Bipolar Transistors Using an Emitter Edge-thinning Design", H. Lin, S. Lee, Appl. Phys. Lett., 47(8), 1985, suggested conserving part of the GaAlAs emitter at the surface of the base, and removing it from only beneath the base ohmic contacts. The drawback of this technique is that, first, it is impossible to control the thickness of the conserved layer, and secondly, that this GaAlAs layer must be cleared in order to produce an ohmic contact of low resistivity. This technique is therefore difficult to make use of, particularly in the case of self-aligned technology.

The paper "Submicron Scaling of AlGAs/GaAs Self-aligned Thin Emitter Heterojunction Bipolar Transistors (SATE-HBT) With Current Gain Independent of Emitter Area", R. J. Malik, L. M. Lunardi, R. W. Ryan, S. C. Shunk, M. D. Feuer, Electron. Lett., 25(17), August 1989, suggested using an ultrathin GaAlAs emitter layer (15 nm) and contacting the base with an AuBe diffusing contact. With this technique, the ohmic contact presents high resistivity. Moreover, the emitter layer thickness requirements result in an extremely large reduction in gain, making this structure virtually unusable. This technology has to the knowledge of the inventors since been abandoned.

Document EP-A-384 113 "Multilayer Base Heterojunction Bipolar Transistor" suggested using a graded Al base, or directly a base made up of 2 successive layers, the upper layer of which is a p type GaAlAs layer with a low Al percentage. This last structure poses a certain number of difficulties, particularly non-selective etching between 30- and 10-percent GaAlAs, higher resistivity contact on 10-percent GaAlAs than on GaAs, lower effectiveness of passivation as Al percentage is reduced, and reduction of injection efficiency.

Document EP-A-387 010 "Heterojunction Bipolar Transistor" also suggests local epitaxy of a high Al-percentage GaAlAs layer onto the base layer. While this technique overcomes selective etching problems, difficulties arise relating to the resistivity of the contact and restarting epitaxy.

Finally, the paper "High Speed Non-self-aligned GaInP/GaAs TEBT", P. Zwicknagl, U. Schaper, L. Scleicher, H. Siweris, K. Bachem, T. Lauterbach, W. Pletschen, Electron. Lett., 28 (3), 1992, suggested producing an emitter layer made up of 2 layers, one in GaAs and the other in GaInP. This solution uses selective etching and also passivation of the emitter-base junction by the GaInP layer. However, this structure, designated "Tunneling Emitter Bipolar Transistor" (TEBT) has a number of drawbacks; first, it presents low gain due to the use of a small energy gap material in the emitter, and secondly, the use of the CrAu contact suggested in this publication does not enable the base layer to be contacted through the GaInP. GaInP must therefore be removed from under the base contact. This technology is therefore difficult to adapt to small-size transistors and transistors made using self-aligned technology.

To conclude, all the solutions put forward to date present technological difficulties, particularly the problem of stability and reliability where several passivating single layers are deposited, non-selective etching when GaAlAs material is used to achieve passivation, the production of low resistivity p-type ohmic contacts on GaAlAs, low gain, etc.

The object of this invention is to perfect existing transistor structures by overcoming the drawbacks of the prior art.

More precisely, the object of this invention is, by using a very simple process, to produce transistors, particularly heterojunction bipolar transistors, of the highest possible performance, in particular high intrinsic gain by improved injection efficiency, this high gain being conserved on small-size transistors by the elimination of surface recombination currents.

SUMMARY OF THE INVENTION

This object is achieved according to the present invention thanks to a transistor of a type which is itself already known and which is made up of layers forming collector, base and emitter, and collector, base and emitter ohmic contacts, characterized in that the emitter is made up of two layers superposed on the base layer: a first thin layer made up of a first material having a wide energy gap and a second layer made up of a second material also having a high energy gap, and in that the base ohmic contact is deposited on the first layer of the emitter.

According to a further advantageous embodiment of this invention, the energy gap of the second layer is preferably smaller or equal to that of the first layer. For a npn transistor, material pairs such as the following are preferably chosen: $\Delta E_v$ (GaAs/material 1)$\geq \Delta E_v$ (GaAs/material 2) and $\Delta E_c$ (GaAs/material 1)$\leq \Delta E_c$ (GaAs/material 2). For a pnp transistor, the two preceding inequalities must be reversed.

$\Delta E_v$ (GaAs/material 1) represents the discontinuity on the valence band between GaAs and the material of the first layer, $\Delta E_v$ (GaAs/material 2) represents the discontinuity on the valence band between GaAs and the material of the second layer, $\Delta E_c$ (GaAs/material 1) represents the discontinuity on the conduction band between GaAs and the material of the first layer and $\Delta E_c$ (GaAs/material 2) represents the discontinuity on the conduction band between GaAs and the material of the second layer.

This invention also concerns a process for fabricating such a transistor.

This process includes the known stages consisting in producing layers forming collector, base and emitter, as well as collector, base and emitter ohmic contacts, and is characterized in that the emitter production stage consists in depositing, on the base layer, two superposed layers making up the emitter: a first thin layer made up of a first material having a wide energy gap and a second layer made up of a second material also having a high energy gap. It is also characterized in that the base ohmic contact is deposited on the first layer of the emitter.

BRIEF DESCRIPTION OF THE DRAWINGS

A full understanding of the other characteristics, objects and advantages of this invention can be gained from the following non-limiting, detailed description of the preferred embodiments when read in conjunction with the accompanying drawings in which.

DESCRIPTION OF THE PREFERRED EMBODIMENTS

The following detailed description of a particular embodiment of a heterojunction bipolar transistor in accordance with the invention relates to the case of use of GaAs, GaAlAs and GaInP materials. However, other materials can be used to obtain the same effect. Thickness and doping values are given for information only.

Figure 1:
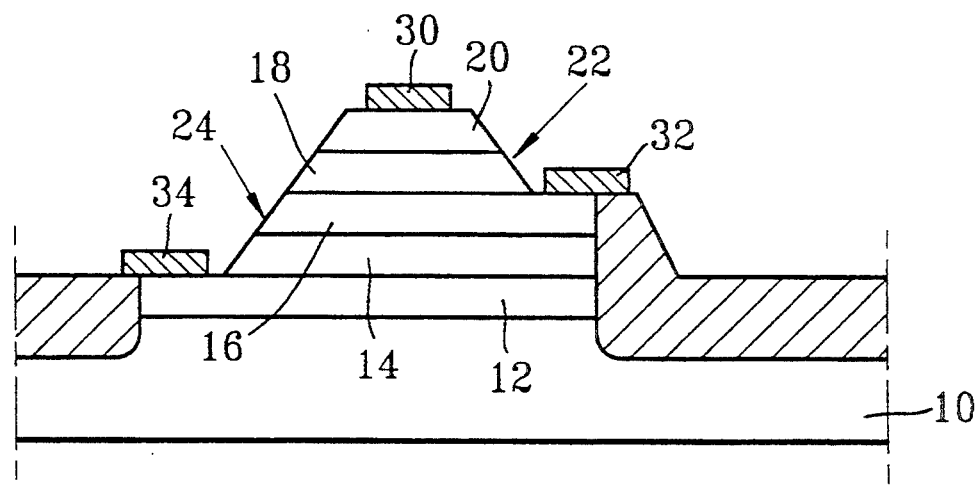
FIG. 1 shows a schematic cross-section of the structure of a heterojunction bipolar transistor in accordance with the prior art as previously described.
Figure 2:
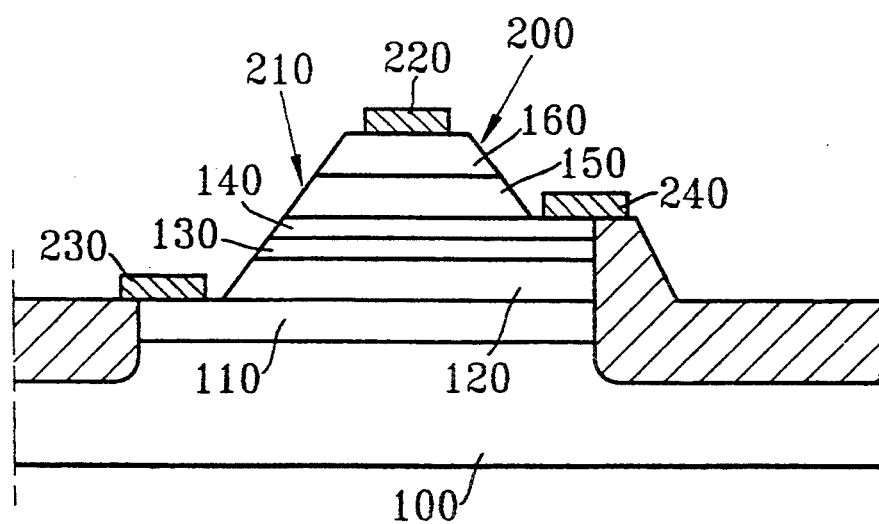
FIG. 2 shows a schematic cross-section of the structure of a transistor in accordance with the invention.

The following can be seen in accompanying FIG. 2 of a heterojunction bipolar transistor in accordance with the invention:

- a III-V semiconductor substrate 100, for example GaAs, of the semi-insulating or conductor type (n or p);
- a first GaAs layer 110 epitaxed on substrate 100; the first layer 110 is of a first type of conductivity and is highly doped in the range $10^{18}$ cm$^{-3}$; it forms the collector contact layer; its thickness is in the range 0.5–1 $\mu$m;
- a second layer 120 in GaAs, GaAlAs or GaInP which is epitaxed on the first layer 110; the second layer 120 is of the first type of conductivity and has a low doping level (in the range $10^{16}$ cm$^{-3}$); it forms the collector layer; its thickness is in the range 0.5–1.5 $\mu$m;
- a third layer 130 with a very high doping level (in the range $10^{19}$–$10^{20}$ cm$^{-3}$) of the second type of conductivity deposited on the second layer 120 to form the base layer; the base layer 130 has a small energy gap; it is typically produced in GaAs. This layer can show a variation in the energy gap by the graded introduction of Al or In. Its thickness is in the range 10–200 nm;
- a fourth layer 140 with a low doping level (in the range $10^{16}$–$10^{17}$ cm$^{-3}$) of the first type of conductivity deposited on the third layer 130; the fourth layer 140 is produced from a different material than the third layer 130, for example with the aid of GaInP; it has a wide energy gap X2; the fourth layer is very thin, typically between 10 and 60 nm, preferably between 20 and 45 nm, and very advantageously in the order of 30 nm;
- a fifth layer 150 with a low doping level (in the range $10^{16}$–$10^{17}$ cm$^{-3}$) of the first type of conductivity deposited on the fourth layer 140; layer 150 has a wide energy gap X3 which is preferably less than or equal to energy gap X2 of the fourth layer 140; it is produced in a different material than the fourth layer 140, typically in Ga$_{1-x}$Al$_x$As where, for example, x equals 30 percent; its thickness is in the range 10–50 nm; the fourth and fifth layers 140 and 150 form in combination the emitter;
- a sixth layer 160 in GaAs or GaInAs of the first type of conductivity, doped to a high level (in the range $10^{18}$–$10^{19}$ cm$^{-3}$), is then deposited on the fifth layer 150 to form the emitter contact layer. Its thickness is in the range 10–20 nm.

Within the scope of the present patent application, "wide energy gap" means a gap wider than that of the subjacent base layer 130. For example, if the energy gap of the GaAs base layer is 1.42, then layer 140 can be GaInP with an energy gap of 1.84, and layer 150 GaAlAs with an energy gap of 1.79.

According to a variant, substrate 100 can be formed from Si or InP, on condition that an intermediary buffer layer is provided, In the case of a npn transistor, the two layers 140 and 150 making up the emitter could be produced, for example, using the following associations: GaAlAs (150)-GaInP (140), GaAlAs or GaInP (150)-GaP(140), AlInAs (150)-InP (140).

Conversely, to produce a pnp transistor, the two layers 140 and 150 making up the emitter could be chosen from the following group:

GaAlAs(140)-GaInP (150), GaAlAs or GaInP(140)-GaP(150), AlInAs (140)-InP (150).

A first etch 200 is made to expose the GaInP emitter-forming layer 140. This stage is achieved using a solution for selectively etching between the GaAlAs material making up layer 150 and the GaInP material making up layer 140. For this operation, the chemical agents $H_3PO_4$-$H_2O_2$-$H_2O$ in the proportions 3-1-40 could, for example, be employed The first etch therefore stops naturally at the surface of the GaInP emitter layer 140.

A second etch 210 is then effected to reach the collector contact layer 110.

The components are then isolated. This isolation could also be performed as the first step. The emitter electrode 220 and the collector electrode 230 are then deposited. This depositing is followed by further annealing of contacts 220 and 230.

The base electrode 240 of the second type is then directly deposited on the GaInP emitter layer 140. The depositing of contact 240 is followed by further annealing.

The purpose of ohmic contact 240 is to contact base layer 130 through the emitter-forming GaInP layer 140. It must present low resistivity.

To achieve this, base contact 240 can be produced, for example, in the form of a diffusing contact such as AuMn. The use of such a diffusing contact, illustrated in FIG. 2 as reference 242, makes it possible to contact the base layer through the GaInP layer 140 and to leave the passivation layer over the entire surface of the component's extrinsic base 130.

The present invention provides a means of obtaining, thanks to this emitter layer 140, a selective etch and passivation of base layer 130, while at the same time increasing injection efficiency.

This new structure in accordance with the present invention therefore makes it possible to obtain both a simple fabrication technology and improved performances by eliminating the gain reduction effect resulting from surface recombinations on small geometries and improving injection efficiency.

The present invention makes it possible to obtain very high gains, for example a gain of 300 for a 50 nm-thick base layer 130 doped to $5.10^{19}$ cm$^{-3}$.

Moreover, by producing the emitter layer 140 in GaInP material, the resistivity of the contact that traverses this layer to contact the base can be made lower than is possible using GaAlAs material.

The present invention relates to npn and pnp transistors.

The present invention also relates to the InP system. For a npn transistor, layer 110 is in GaInAs; layer 120 in GaInAs, AlInAs or Inp; layer 130 in GaInAs; layer 140 in InP; layer 150 in AlInAs and layer 160 in InGaAs.

For a pnp transistor, the nature of layers 140 and 150 is reversed: layer 140 is in AlInAs and layer 150 in InP.

The present invention allows transistors to be produced in conventional double mesa technology (as previously described), and also self-aligned technology. Self-aligned technology makes it possible to place an emitter contact very close to the base contact and to produce them using the same etching level. In this last case, after layer 150 has been etched, the emitter and base contacts can be self-aligned with dielectric spacers, or under etch layers 150 and/or 160 to self-align the base contact with respect to the emitter contact.

The invention mainly relates to the field of micro-electronics and micro-optronics.

More particularly, the invention relates to the production of single or double heterojunction bipolar transistors, notably on GaAs or InP substrates, and to the associated circuits. However, the present invention, more precisely the excellent etching selectivity between GaInP and GaAs or GaAlAs, can also relate to the production of field-effect transistors such as MEFETs, HFETs, HMETs, etc., and to the circuits produced with these devices, by replacing, for example, the conventional GaAlAs/AlAs material pair which presents technological difficulties.

Besides the above-mentioned advantages resulting from the structure in accordance with the present invention, the inventors noticed that the first GaInP emitter layer 140 prevents the conventional beryllium dope of the subjacent base 130 from diffusing. Thus, the structure of the present invention enables Be dope to be applied to the base 130 using conventional molecular beam epitaxy, and avoids recourse to a more sophisticated technique, already developed, which applies carbon dope to prevent the diffusion of beryllium, a technique common to known prior art structures.

The present invention is naturally not solely limited to the particular embodiments described above but extends to all variants conceived in accordance with its underlying principles.

We claim:

1. Transistor comprising layers forming collector, base and emitter, and collector, base and emitter ohmic contacts, wherein:
   the emitter is made up of two layers of semiconductor material of a first type of conductivity superposed on the base layer: a first thin layer made up of a first material having a large energy gap and a second layer made up of a second material also having a large energy gap;
   the base is made up of a semiconductor material of a second type of conductivity;
   the collector is made up of a semiconductor material of the first type of conductivity; and
   the base ohmic contact is deposited on the first thin layer making up the emitter.

2. The transistor of claim 1 wherein the energy gap of the second layer is smaller or equal to that of the first thin layer.

3. The transistor of claim 1 wherein for a npn transistor, the energy discontinuity between the valence band of GaAs and the valence band of the material for the first thin layer is greater than the energy discontinuity between the valence band of GaAs and the valence band of the for the second layer, whereas the energy discontinuity between the conduction band of GaAs and the conduction band of the material for the first thin layer is smaller than the energy discontinuity between the conduction band of GaAs and the conduction band of the material for the second layer.

4. The transistor of claim 1 wherein for a pnp transistor, the energy discontinuity between the valence band of GaAs and the valence band of the material for the first thin layer is smaller than the energy discontinuity between the valence band of GaAs and the valence band of the material for the second layer, whereas the energy discontinuity between the conduction band of GaAs and the conduction band of the material for the first thin layer is greater than the energy discontinuity between the conduction band of GaAs and the conduction band of the material for the second layer.

5. The transistor of claim 1 wherein the material used for the first thin layer forming the emitter has greater resistance to a chosen etching agent than the material used for the second layer forming the emitter.

6. The transistor of claim 1 wherein for a npn transistor, the materials making up the two layers of the emitter are chosen from the following pairs:
GaInP for the first thin layer and GaAlAs for the second layer;
GaP for the first thin layer and GaAlAs or GaInP for the second layer;
InP for the first thin layer and AlInAs for the second layer.

7. The transistor of claim 1 wherein for a pnp transistor, the materials making up the two layers of the emitter are chosen from the following pairs:
GaInP for the second layer and GaAlAs for the first thin layer;
GaP for the second layer and GaAlAs or GaInP for the first thin layer;
InP for the second layer and AlInAs for the first thin layer.

8. The transistor of claim 1 wherein for a npn transistor, the first thin layer is in InP whereas the second layer is in AlInAs.

9. The transistor of claim 1 wherein for a pnp transistor, the first thin layer is in AlInAs whereas the second layer is in InP.

10. The transistor of claim 1 wherein it comprises two etchings revealing, respectively, the first thin layer of the emitter and a collector contact layer.

11. The transistor of claim 1 wherein it comprises:
on a substrate, a heavily doped layer of a first type of conductivity forming the collector contact layer;
on the collector contact layer, a lightly doped layer of the first type of conductivity forming the collector layer;
on the collector layer, a very heavily doped layer of the second type of conductivity forming the base layer;
on the base layer, a thin layer of the first type of conductivity in a first material having a wide energy gap, forming the first thin emitter layer;
on the first emitter layer, a second layer made up of a second material also having a high energy gap, forming the second emitter layer; and
on the second emitter layer, a heavily doped layer of the first type of conductivity forming the emitter contact layer.

12. The transistor of claim 1 wherein the thickness of the first thin layer making up the emitter is between 10 and 60 nm, preferably between 20 and 45 nm, very advantageously in the order of 30 nm.

13. The transistor of claim 1 wherein the first thin layer making up the emitter is doped to a level in the range $10^{16}$–$10^{17}$ cm$^{-3}$.

14. The transistor of claim 1 wherein the second layer making up the emitter is formed from $Ga_{1-x}Al_xAs$.

15. The transistor of claim 1 wherein the first thin layer making up the emitter is formed from GaInP.

16. The transistor of claim 1 wherein the collector layer is produced in GaAs, GaAlAs or GaInP.

17. The transistor of claim 1 wherein the base layer is in GaAs, GaAlAs or GaInAs.

18. The transistor of claim 1 wherein ohmic contacts are deposited respectively on the emitter contact and collector contact layers.

19. The transistor of claim 1 wherein the base ohmic contact is a diffusing contact.

20. The transistor of claim 1 wherein the base ohmic contact is produced in AuMn.

21. The transistor of claim 1 wherein it is produced using self-aligned technology.

22. Transistor comprising:
a semiconductor substrate;
a semiconductor collector contact layer of a first type of conductivity, epitaxed on said substrate;
a semiconductor collector layer of the first type of conductivity epitaxed on said semiconductor collector contact layer;
a semiconductor base layer of a second type of conductivity epitaxed on said semiconductor collector layer;
a first semiconductor layer of the first type of conductivity epitaxed on said semiconductor base layer;
a second semiconductor layer of the first type of conductivity epitaxed on said first semiconductor layer, said first semiconductor layer and second semiconductor layer forming in combination an emitter layer;
a semiconductor emitter contact layer of the first type of conductivity epitaxed on said second semiconductor layer;
a collector ohmic contact deposited on said semiconductor collector contact layer;
an emitter ohmic contact deposited on said semiconductor emitter contact layer; and
a diffusing ohmic contact deposited on the first layer making up the emitter.

* * * * *